United States Patent [19]

Halversen

[11] Patent Number: 4,997,993

[45] Date of Patent: Mar. 5, 1991

[54] METHOD AND APPARATUS FOR SEALING MOVABLE PANEL AND MAINTAINING LOW SIGNATURE INTEGRITY

[75] Inventor: Gregory V. Halversen, Kent, Wash.

[73] Assignee: The Boeing Company, Seattle, Wash.

[21] Appl. No.: 466,464

[22] Filed: Jan. 17, 1990

[51] Int. Cl.⁵ .............................................. H05K 9/00
[52] U.S. Cl. ................................. 174/35 R; 361/218
[58] Field of Search .......... 174/35 GC, 35 MS, 35 R; 277/53, 55, 56; 361/218; 244/126, 131, 129.4, 129.5

[56] References Cited

U.S. PATENT DOCUMENTS

| | | | |
|---|---|---|---|
| 2,905,924 | 9/1959 | Peterson | 339/273 |
| 3,172,982 | 3/1965 | Reed | 200/166 |
| 3,507,974 | 4/1970 | Clark et al. | 174/35 MS |
| 3,518,355 | 6/1970 | Luce | 174/35 MS |
| 4,177,353 | 12/1979 | McCormack | 174/35 GC |
| 4,239,046 | 12/1980 | Ong | 128/640 |
| 4,308,417 | 12/1981 | Martin | 174/35 GC |
| 4,371,175 | 2/1983 | Van Dyk, Jr. | 277/34 |
| 4,408,255 | 10/1983 | Adkins | 361/382 |
| 4,894,489 | 1/1990 | Takahashi et al. | 174/35 MS |

FOREIGN PATENT DOCUMENTS 457574 8/1968 Switzerland .
574401 1/1946 United Kingdom .

OTHER PUBLICATIONS

Evans et al., "Compliant EMC Shield for Movable Covers", IBM Technical Disclosure Bulletin, vol. 22, No. 8A, *IBM Corporation*, Jan. 1980, pp. 3308 and 3309.

*Primary Examiner*—Leo P. Picard
*Assistant Examiner*—Bot Lee Ledynh
*Attorney, Agent, or Firm*—Joan H. Pauly

[57] ABSTRACT

Two sets of filaments (38, 72) are mounted on opposite sides of a discontinuity (6) between a movable or removable panel (4) and adjacent outer skin portions (2) of an aircraft. The filaments (38, 72) have retracted positions in which they are out of engagement with each other. With the filaments (38, 72) retracted, the panel (4) is moved into its use position flush with the outer surface of the skin (2). The filaments (38, 72) are then extended into the discontinuity (6) by a mechanism, such as a cam-ratchet (44) or an inflatable bladder (68). The extended filaments (38, 72) interdigitate to seal the discontinuity (6) and simulate a solid surface across the discontinuity (6).

11 Claims, 3 Drawing Sheets

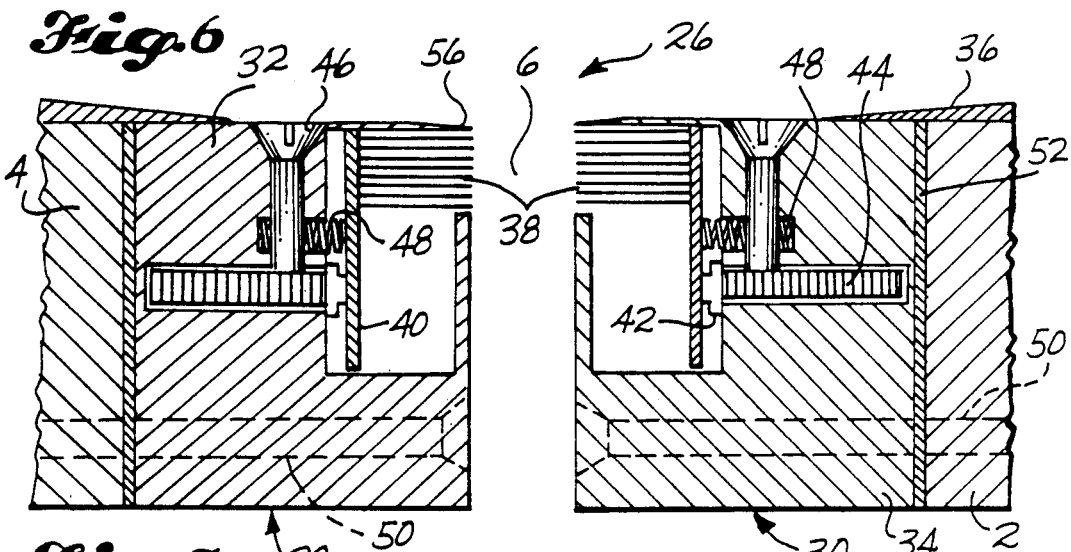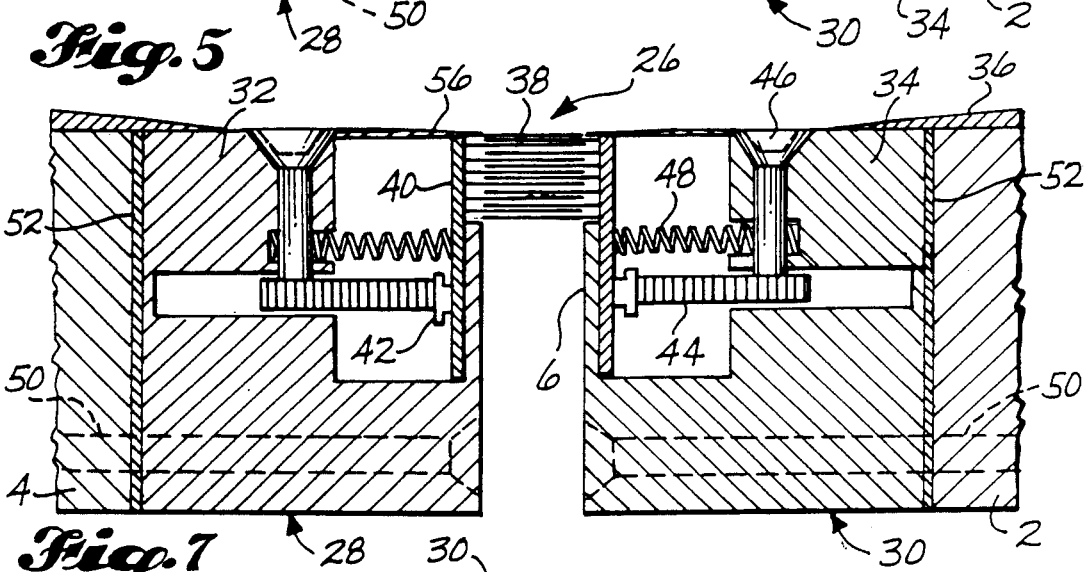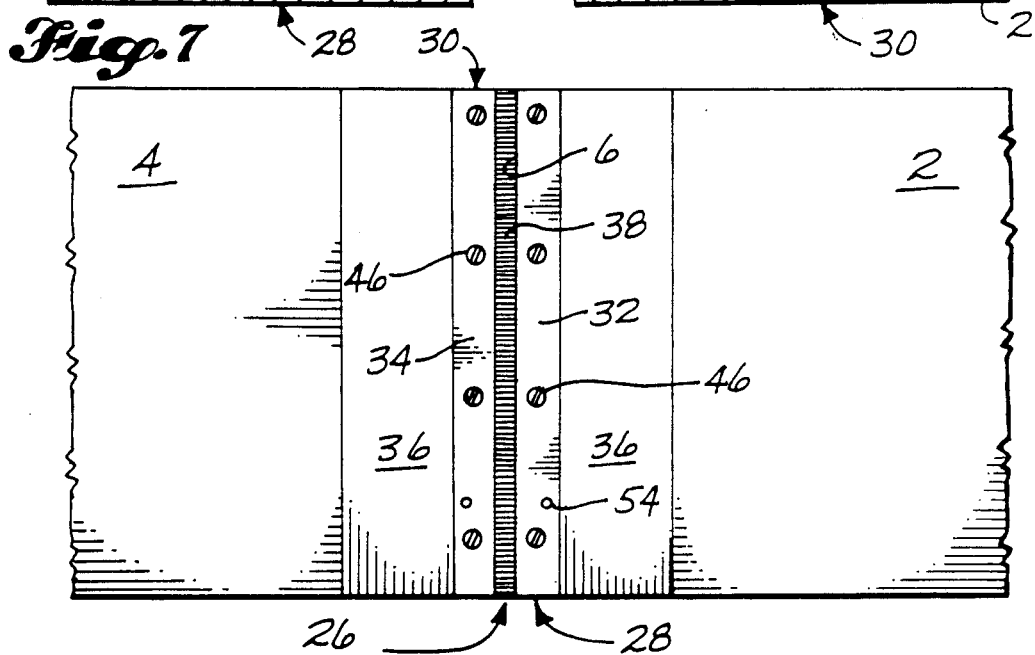

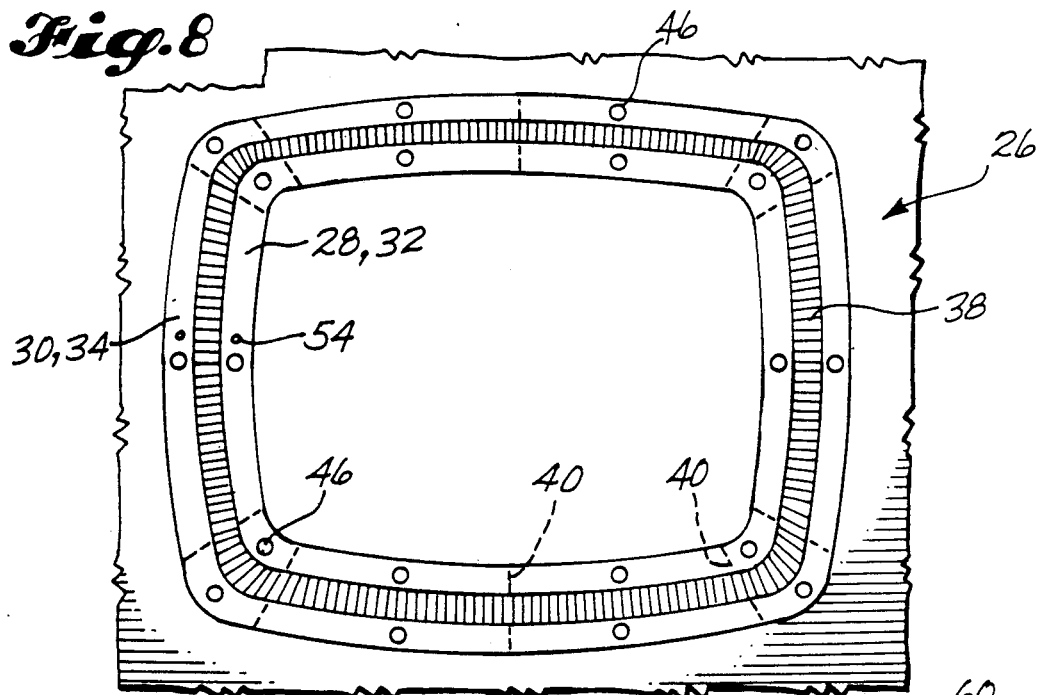
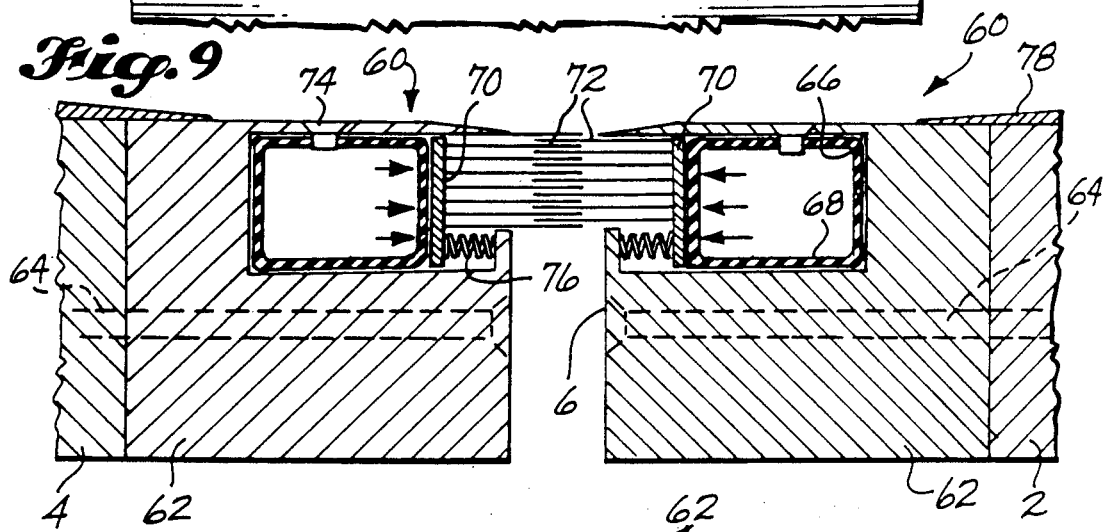
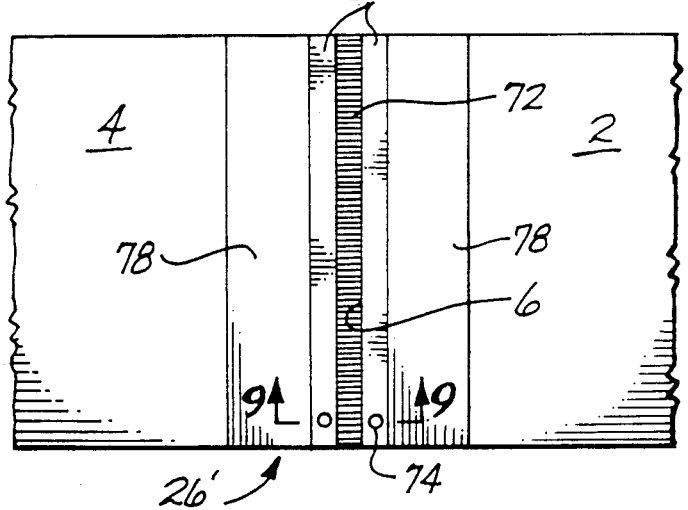

METHOD AND APPARATUS FOR SEALING MOVABLE PANEL AND MAINTAINING LOW SIGNATURE INTEGRITY

TECHNICAL FIELD

This invention relates to seals for providing electrical continuity across discontinuities in the outer skins of vehicles, such as aircraft, and maintaining the low electromagnetic signature integrity of such skins and, more particularly, to such a seal that includes conductive brushes mounted on opposite sides of the discontinuity with bristles movable between a retracted position and an extended position in which the bristles are interdigitated to simulate a continuous conducting surface.

BACKGROUND ART

In aircraft, there are normally unavoidable discontinuities in the outer skin. Such discontinuities occur, for example, at the interface of adjacent panels and where access panels or doors are formed in the skin. In many situations, it is desirable to seal these discontinuities and/or provide a continuous electrical path along the outer surface of the skin across the discontinuities. One such situation is when the low electromagnetic signature integrity of the aircraft need to be preserved.

There are currently a number of known approaches to the problem of sealing movable and removable panels. One approach, illustrated in FIG. 1, is to use conductive putty 14 to fill a discontinuity 6 between the edge of a panel 4 and the portion 2 of the skin defining the opening in which the panel 4 is received. The conductive putty seal may be enhanced by covering it with a metallic tape 16. With or without the conductive tape 16, a conductive putty seal generally gives a very low signature. However, the use of the putty presents a number of problems. These problems include a time consuming installation procedure. The putty must be applied, cured for four to twenty-four hours depending on temperature, and sanded smooth. Another problem is that the putty tends to fail when the aircraft is in flight because the putty is hard after it cures and can crack and fall out if the panel moves. In addition, a conductive putty seal cannot be removed without destroying it by cutting or chipping it out. This removal procedure is also time consuming. Another problem is that the putty cannot be used on doors or panels that must be opened during flight.

Another known approach is to use a blade seal 18 which is attached to the panel 4 and sits over the top of the panel to skin gap 6, as shown in FIG. 2. This approach avoids the problems of time consuming installation and removal procedures and inability to move the panel when the seal is in place. However, there are a number of problems associated with the use of blade seals. Fasteners 20 are required to attach the seal to the panel, and rabbet cuts 21 on the panel are needed to make the seal essentially flush with the outer surface of the panel. Both the fasteners and rabbet cuts add to the weight of the panel by requiring increased thickness of the panel, such as additional layers of a composite material panel. Another problem is that a blade seal is difficult to mold around a panel corner. Blade seals have also been found to be relatively unreliable in maintaining the low signature integrity of the aircraft. The occurrence of electromagnetic scattering around blade seals at various points on the seal has been observed. In addition, blade seals have been known to lift up and thereby cause substantial electromagnetic problems. Another problem associated with blade seals is that they are very thin and sharp. This makes them subject to breaking off and dangerous to handle.

A third approach to the movable panel seal problem is the use of a conductive elastomer bulb seal, such as the seal 22 shown in FIG. 3. Such seals have the advantages of being formable into almost any shape and being relatively inexpensive. There are, however, drawbacks to the use of bulb seals. The seals tend to bulge up out of the gap if the panel and skin move relative to each other or if manufacturing tolerances result in variations in the gap width. The bulging usually increases the signature from the gap. Bulb seals are also difficult to form around panel corners. The effectiveness of bulb seals is limited because they create a step discontinuity between the seal and the side of the panel which in turn causes electromagnetic scattering.

IBM Technical Disclosure Bulletin, Vol. 22, No. 8A, January 1980 discloses compliant electromagnetic compatible shield for movable covers. The shield is for covers that slide longitudinally and is shown engaging the edge of a cover received into a three-sided recess. Wire brushes are mounted on opposite sides of the cover in the recess and are oriented at an acute angle to the cover. The ends of the bristles are trimmed at an angle. The differential force on the two sides of the cover created by the brushes keeps the cover laterally centered as it moves. The shield is described as providing "virtually complete metallic EMC effect".

U.S. Pat. No. 4,308,417, granted Dec. 29, 1981, to S. H. Martin, discloses an electromagnetic seal for a door or an aperture for wires. The seal includes a plurality of flexible filaments. The majority of the filament's are insulative, with the rest being conductive and interspersed among the insulative filaments. In the door seal application, the filaments are lightly compressed when the door is closed. In the application for sealing a hole in an enclosure wall, a pair of sealing devices is mounted on the wall on opposite sides of the hole. The filaments extend across and cover the hole. The wires pass through the flexible filaments. The ends of the filaments intermingle.

Swiss Pat. No. 457,574, published Aug. 15, 1968, shows an apparently similar system for sealing an aperture in which opposing brushes laterally abut each other.

Sealing arrangements for electromagnetic or radio frequency shielding of a door structure are disclosed in U.S. Pat. No. 3,507,974, granted Apr. 21, 1970, to D. B. Clark et al.; U.S. Pat. No. 3,518,355, granted June 30, 1970, to C. T. Luce; U.S. Pat. No. 4,177,353, granted Dec. 4, 1979, to R. G. McCormack; and U.S. Pat. No. 4,371,175, granted Feb. 1, 1983, to G. C. Van Dyk, Jr. Each of these shielding arrangements includes an inflatable bladder. In the Clark et al system, a bladder is inflated to flex a finger stock, resembling an elongated leaf spring, into engagement with the door frame. In the Luce system, a bladder is inflated to urge the door against a seating surface. The McCormack system is similar to the Luce system and includes a bladder with a conductive coating. Van Dyk, Jr. discloses an inflatable gasket inside a flexible conductive shielding mounted on the door frame.

The devices discussed above and the prior art cited in the above patents should be studied for the purpose of putting the present invention into proper perspective relative to the prior art.

SUMMARY OF THE INVENTION

The invention relates to a system for sealing a discontinuity between a movable panel in the outer skin of a vehicle and adjacent portions of the skin and maintaining low electromagnetic signature integrity of the skin in the vicinity of the panel. The invention has method and apparatus aspects. According to an aspect of the invention, the method comprises mounting first and second sets of filaments on the adjacent portions of the skin and the panel, respectively. At least one set of filaments is positioned in a retracted position to allow the sets to clear each other when the panel is moved. With the one set in the retracted position, the panel is moved to position it substantially flush with the adjacent portions of the skin. Each set of filaments is positioned to extend into the discontinuity, substantially flush with the outer surfaces of the panel and the adjacent skin portions, and interdigitate with the filaments of the other set. The positioning of the sets of filaments includes moving said one set out of the retracted position. The positioning of the sets seals the discontinuity and simulates a solid surface across the discontinuity.

In the practice of the method of the invention, either one or both of the sets of filaments may be positioned in retracted positions before moving the panel into a position substantially flush with the adjacent skin portions. Retracting only one set of filaments has the advantage of providing the desired clearance of the sets of filaments in a relatively simple manner. Retracting both sets has the advantages of providing increased protection of the filaments against damage when the panel is moved and more readily accommodating a movable but nonremovable panel, such as one which is hinged to or slidably attached to the surrounding portions of the skin. As used herein, the term "movable panel" is intended to encompass attached panels which move relative to the surrounding skin portions as well as panels which are entirely detachable and removable. The adjacent skin portions may be fixed or may themselves include an additional movable panel or panels.

The two sets of filaments are generally preferably coextensive along the periphery of the movable panel. They may extend along all or part of the periphery, depending on the sealing and signature requirements of a particular situation. In either case, an optional feature of the invention is moving the set of filaments out of its retracted position in separate sections, rather than moving the entire set as a single unit. This feature of separately moving sections is particularly advantageous when the panel has an irregular shape or it is desirable to provide enhanced compensation for variances in manufacturing tolerances around the periphery of the panel. The moving of the filaments in sections allows differential adjustment of the extension and retraction of the filaments in different areas of the periphery.

The method of the invention may further comprise, after positioning the sets of filaments to seal the discontinuity, retracting the one set of filaments into its retracted position, moving the panel into an open position, and then repeating the steps of moving the panel to be substantially flush with the adjacent skin portions and positioning the sets to extend into the discontinuity. While the panel is in its open position, ground repair and maintenance procedures may be carried out. In addition, operational procedures requiring the opening of the panel may be carried out during use of the vehicle by following these additional method steps. For example, in the case of an aircraft in flight, sealed doors may be opened to allow lowering of landing gear. The ability to unseal and reseal the discontinuity around a movable panel in an aircraft skin during flight is one of the significant advantages of the invention.

The apparatus of the invention basically comprises a retracting mechanism, and first and second sets of a plurality of filaments mounted on the adjacent skin portions to extend toward the panel and on the panel to extend toward the first set, respectively. Each set of filaments has an extended position in which it interdigitates with the filaments of the other set to seal the discontinuity, as described above. The overall electrical conductivity of the filaments of the two sets is sufficient to maintain low signature integrity across the discontinuity. The level of conductivity required to accomplish this is relative to the conductivity of the adjacent skin portions. The retracting mechanism of the apparatus retracts the filaments of at least one set out of engagement with the filaments of the other set. In some situations, it is preferable that the filaments of both sets are retractable by the retracting mechanism, as discussed above.

The retracting mechanism may take various forms. In a currently preferred embodiment, the mechanism includes a bladder positioned to move the set of filaments into interdigitating engagement with the other set when the bladder is inflated. Such a bladder-type mechanism may also include a spring positioned to retract the set when the bladder is deflated. In another currently preferred embodiment, the retracting mechanism includes a mounting member to which the filaments are secured, and a cam for moving the mounting member. This arrangement has the advantage of readily accommodating moving the filaments in sections since the mounting member may include a plurality of separately extendible and retractable sections. The bladder-type mechanism has the advantages of relative simplicity and ease of design.

The system of the invention provides a highly effective and reliable means for sealing discontinuities and maintaining the low signature integrity of a vehicle, such as an aircraft. The invention accomplishes this while avoiding the problems discussed above that have been encounted with known approaches. The invention avoids the problem of time consuming panel installation and removal procedures and thereby greatly reduces the time and cost of maintaining and repairing the vehicle in which the panel and seal are installed. The seal system of the invention is not subject to decreased effectiveness during use of the vehicle, such as flight of an aircraft. When installed in an aircraft, the seal will not lift or bulge during flight and thereby compromise the maintenance of low signature integrity. The seal system of the invention tolerates relative movement of the panel and the adjacent skin portions without damage to the seal or compromising the signature integrity. The seal of the invention is also reusable in the sense that the panel may be opened and the seal sealed and unsealed repeatedly without sacrificing the effectiveness of the seal when the panel is in its use position. The sealing and unsealing may be accomplished automatically and, therefore, can be carried out in various circumstances, including flight conditions.

Sealing around panel corners is made relatively easy by the invention. In addition, the seal of the invention is highly durable and helps eliminate safety problems associated with sharp edges. The seal of the invention is also relatively easy to engage and disengage and has few maintenance requirements. The use of the system of the invention facilitates containment of the cost of the overall vehicle by readily accommodating tolerance mismatches between surface panels.

These and other advantages and features will become apparent from the detailed description of the best modes for carrying out the invention that follows.

BRIEF DESCRIPTION OF THE DRAWINGS

In the drawings, like element designations refer to like parts throughout, and:

FIG. 5 is an enlarged sectional view showing a first preferred embodiment of the invention, with the filaments in extended positions.

FIG. 6 is like FIG. 5 except that it shows the filaments in their retracted positions.

FIG. 7 is a top plan view of the embodiment shown in FIGS. 5 and 6 installed along one edge of a panel.

FIG. 8 is like FIG. 7 except that it shows an installation extending around the entire periphery of a panel.

FIG. 9 is an enlarged sectional view of a second preferred embodiment, with the filaments shown being extended.

FIG. 10 is a top plan view showing the embodiment of FIG. 9 installed along a panel edge.

BEST MODES FOR CARRYING OUT THE INVENTION

Figure 1:
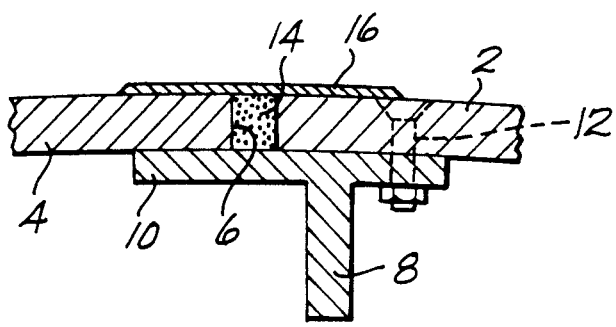
FIGS. 1-3 are sectional views of three different types of prior art sealing arrangements.

The drawings show two embodiments of sealing apparatus 26, 26' which are constructed according to the invention and also constitute the best modes for carrying out the apparatus aspects of the invention currently known to the applicant. The drawings also illustrate the best modes for carrying out the method of the invention currently known to the applicant. In the drawings, the seal system of the invention is shown in use to seal a discontinuity 6 between a removable panel 4 and the adjacent fixed skin portions 2 of an aircraft. It is anticipated that the type of installation illustrated will be a primary application of the system of the invention. However, it is of course to be understood that the seal system of the invention may also be used to advantage in other types of vehicles and in other types of aircraft installations. For example, the panel 4 could be movably attached to the adjacent skin 2 and openable without detaching and removing it from the skin. In addition, the skin portion 2 adjacent to the panel 4 could itself be a movable or removable panel.

Figure 2:
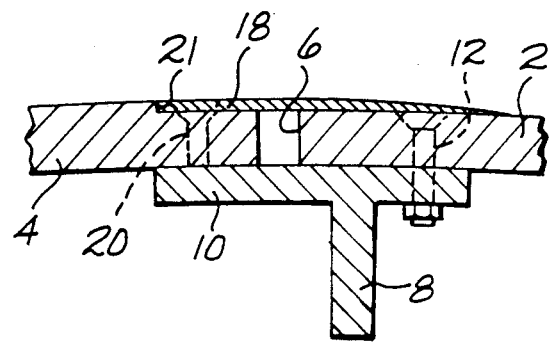
Figure 3:
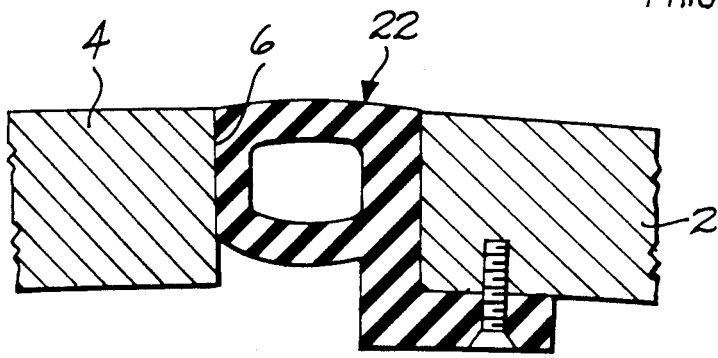
Figure 4:
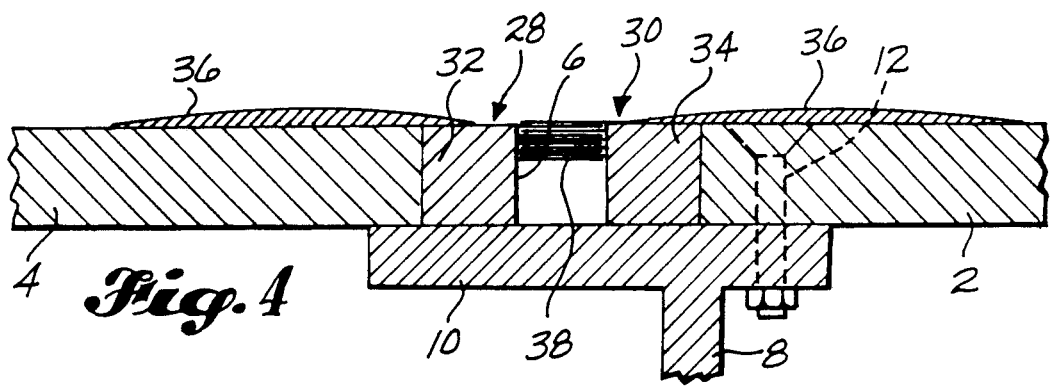
FIG. 4 is a sectional view of the preferred installation arrangement of the system of the invention.

In FIG. 4, the fixed skin portion 2 adjacent to the panel 4 is shown secured to a supporting rib 8. The skin 2 is attached by means of fasteners 12 extending through the rib's mounting flange 10. The mounting flange 10 extends along and beyond the inner surface of the skin portion 2 to provide a support for the periphery of the panel 4. This type of support structure is commonly used and is also shown in FIGS. 1 and 2, which illustrate known types of seals, as discussed above. A simplified form of the support structure is illustrated. In actual aircraft installations, the support structure varies widely and can be quite complex. The support structure forms no part of the present invention.

Still referring to FIG. 4, the apparatus of the invention includes two portions, a panel portion 28 and a skin portion 30. Each of these portions 28, 30 preferably includes a housing 32, 34 secured to the peripheral side edge of the corresponding panel 4 and skin portion 2, respectively. The housings 32, 34 may be secured for example, by means of fasteners 50, as shown in FIGS. 5 and 6. The housings 32, 34 provide space for the retracting mechanism and the retracted filaments 38. The edges of the skin 2 and panel 4 adjacent to the discontinuity 6 are preferably treated to reduce electromagnetic scattering. The edge treatment 36 may comprise a special coating or filler or a layer of material, such as a layer of composite material. Such a layer of composite material could be a magnetic radar absorber, a resistive sheet, or a layer of graphite fiber/resin matrix material. When appropriate, the edge treatment 36 may be integrally formed as part of underlying composite material structure.

FIGS. 5-8 illustrate a first preferred embodiment 26 of the apparatus of the invention. The apparatus 26 includes two substantially identical halves 28, 30 secured to the movable panel 4 and the adjacent skin portion 2, respectively. When the adjacent panel material or skin material contains graphite, the housings 32, 34 preferably have a non-corrosive back plate 52. A brush-like set of a plurality of filaments 38 is mounted in each of the housings 32, 34. The filaments 38 are oriented so that, in their retracted positions shown in FIG. 6, the filaments 38 in the opposite sets extend toward each other with their outer ends confronting each other. The filaments 38 are mounted by a mounting member 40 elongated along the length of the panel/skin interface and the discontinuity 6 at such interface. The mounting member 40 may be formed by a plurality of separately extendible and retractable sections, as indicated in broken lines in FIG. 8.

The mechanism for extending and retracting the filaments 38 is shown in partially schematic form in FIGS. 5 and 6. The mechanism includes a pawl 42 carried by the mounting member 40. The pawl 42 engages a cam-ratchet 44 A screw actuator 46 is accessible from the exterior of the aircraft to operate the cam-ratchet 44. A tension spring 48 biases the filaments 38 secured to the mounting member 40 into their retracted position shown in FIG. 6. FIGS. 7 and 8 illustrate the appearance of the system 26 from the exterior of the aircraft FIG. 7 illustrates the sealing of a single edge of a panel 4. FIG. 8 illustrates sealing around the entire periphery of a removable panel 4. In each case, a quick release hole 54 is provided on each side of the seal 26 to release the mounting member 40 and allow the spring 48 to move the member 40 and filaments 38 into their retracted positions shown in FIG. 6. The details of the structure of the retracting mechanism may take various known forms and to date have not been fully determined.

FIGS. 9 and 10 show a second preferred embodiment 26' of the apparatus of the invention Like the first embodiment 26, the apparatus 26', shown in FIGS. 9 and 10 preferably includes two substantially identical halves 60. The details of the apparatus 26' are shown somewhat schematically in FIGS. 9 and 10. Each unit 60 includes a housing 62 attached to a movable panel 4 or skin portion 2 by a fastener 64 in the same manner that the housings 32, 34 of the first embodiment are attached by fasteners 50.

The housing 62 defines a variable volume chamber 66. An inflatable bladder 68 is positioned in the chamber 66. The chamber 66 has a movable wall 70 to which a set of filaments 72 is secured. As shown in FIGS. 9 and 10, the bladder in each of the two opposite units 60 is provided with an inflation valve 74. The valve 74 is similar to the inflation valve of a basketball and allows introduction of air or another fluid to inflate the bladder 68 and thereby move the movable wall 70 toward the opposite unit 60. This causes the filaments 72 to be extended into the discontinuity 6 between the panel 4 and adjacent skin 2. A compression spring 76 is provided to automatically retract the filaments 72 into their retracted positions upon deflation of the bladder 68. Edge treatment 78 to reduce electromagnetic scattering is preferably provided on each side of the discontinuity 6.

The two illustrated embodiments of the retracting and extending mechanism and the filament mounting arrangement are currently preferred However, other known types of actuating mechanisms, such as a gear arrangement, may also be used. Gear arrangements and similar devices, like the illustrated ratchet and cam arrangement, have the advantage of readily accommodating extending the filaments in sections along the periphery of the panel 4. As noted above, the bladder arrangement has the advantages of simplicity and of requiring a relatively small amount of design work to be put into actual use. When opening the panel 4 during operation of the vehicle, e.g. flight of the aircraft, is desirable and/or necessary, means for activating retraction of the filaments 38, 72 from within the vehicle may be provided.

In the method of the invention, the filaments 38, 72 are mounted on their respective structures 2, 4 simply by attaching the housings 32, 34, 62 to the structures 2, 4. The removable panel 4 is installed or reinstalled in the skin, or, in the case of a movable but attached panel 4, is moved into its use position flush with the surrounding skin portions 2, with the filaments 38, 72 on both sides of the discontinuity 6 in their retracted positions. The two sets of retracted filaments 38, 72 easily clear each other to avoid damage to the filaments 38, 72 and/or interference with the positioning of the panel 4. As the panel 4 is moved, the cam-ratchets 44 are positioned, or the bladders 68 are deflated, to permit the springs 48, 76 to maintain the filaments 38, 72 in their retracted positions. The retracted filament positions are shown in FIG. 6. The filaments 38 are preferably retracted all the way into the housings 32, 34 to maximize the protection against filament damage or interference with panel movement.

Once the panel 4 is in place the filaments 38, 72 may be extended out of the housings 32, 34, 62 to extend into the discontinuity 6 In the case of the embodiment shown in FIGS. 5-8, the filaments 38 are extended by actuating the screws 46 in a known manner. The screws 46 may be turned differential amounts to provide for greater or less extension in different areas around the periphery of the panel 4. Thus, irregularities in the shape of the panel 4 and/or variations in the tolerances around the periphery of the panel 4 may quickly and easily be compensated to provide an effective and secure seal around the entire periphery. In the case of the embodiment shown in FIGS. 9 and 10, the filaments 72 are extended simply by introducing a fluid into the bladders 68 through the valves 74.

As can best be seen in FIGS. 4 and 5, when the filaments 38, 72 are in their extended sealing position, the filaments 38, 72 of one set interdigitate with the filaments 38, 72 of the other set to simulate a solid surface across the discontinuity 6. The filaments 38, 72 of each set extend essentially all the way across the discontinuity 6 to the opposite housing 32, 34, 62, as shown in FIGS. 4 and 5 The body formed by the interdigitating filaments 38, 72 is substantially flush with the outer surfaces of the panel 4 and the adjacent skin portions 2. The filaments 38, 72 seal the discontinuity 6 to make it essentially airtight and aerodynamic and to shield interior portions of the aircraft against electromagnetic radiation. The filaments 38, 72 also provide a continuous path for electrical current to travel across the discontinuity 6. This continuous path links the outer surfaces of the panel 4 and the adjacent skin 2 so that current may travel continuously across such outer surfaces.

When the filaments 38, 72, are in their extended sealing positions shown in FIGS. 4, 5, 7, 8, and 10, they act to maintain low electromagnetic signature integrity of the skin in the vicinity of the panel 4. For example, in the case of an aircraft, the details of the panel structure will not dominate the radar return from the aircraft, and the panel will be virtually invisible to radar. The filaments 38, 72 are sufficiently flexible to allow them to interdigitate and essentially fill the outer portion of the discontinuity 6, and sufficiently stiff to maintain their position in flight conditions and to simulate a constant conducting surface In order to eliminate, or at least maximally minimize, any signature of a step between the outer edges of the housings 32, 34, 62, the wall of each housing 32, 34, 62 on the outer surface of the aircraft or other vehicle adjacent to the filaments 38, 72 is preferably ground down to a sharp edge 56.

When it is desired to open the panel 4 in order to carry out maintenance, repair, or operational procedures, the filaments 38, 72 are returned to their retracted positions In the case of the illustrated embodiments, this is accomplished by releasing the cam-ratchets 44 or deflating the bladders 68. After the filaments 38,172 are retracted, the panel 4 may be opened. Resecuring the panel 4 following completion of the required procedures is accomplished in the manner described above.

The filaments 38, 72 have a diameter similar to a toothbrush bristle and may be made from various materials having appropriate electrical conductivity, flexibility, stiffness, and durability The conductivity may be a property of the material forming the body of the filaments, or may be provided by suitable coatings The cross-sectional shape of the filaments may take various forms. For example, it may be circular or substantially diamond-shaped, like the teeth of a comb, to facilitate the filaments sliding past each other. It is currently anticipated that the filaments 38, 72 will all be made from the same material. However, it is within the scope of the invention to vary the material from which the filaments 38, 72 are made. For example, the filaments 38 72 may be provided in an outer conductive layer and an insulated inner layer Another alternative would be to intersperse conductive filaments and non-conductive filaments. Whatever the details of the structure of the filaments 38, 72, their overall electrical conductivity is sufficient to maintain low signature integrity across the discontinuity 6.

Although the preferred embodiments of the invention have been illustrated and described herein, it is intended to be understood by those skilled in the art that various modifications and omissions in form and detail may be made without departing from the spirit and scope of the invention as defined by the following claims.

What is claimed is:

1. A method of sealing a discontinuity between a movable panel in the outer skin of a vehicle and adjacent portions of said skin and making the discontinuity virtually invisible to radar, comprising:
   mounting first and second sets of filaments on said adjacent portions and said panel, respectively;
   positioning at least one said set of filaments in a retracted position to allow said sets to clear each other when said panel is moved;
   with said one set in said retracted position, moving said panel to position it substantially flush with said adjacent portions; and
   positioning each said set of filaments to extend into the discontinuity, substantially flush with the outer surfaces of said panel and said adjacent portions, and interdigitate with the filaments of the other set, including moving said one set out of said retracted position, to seal the discontinuity and simulate a solid surface across the discontinuity.

2. The method of claim 1, comprising positioning both said sets of filaments in retracted positions before moving said panel.

3. The method of claim 1, in which the step of moving said one set out of said retracted position includes moving said one set in separate sections.

4. The method of claim 1, further comprising, after positioning said sets to seal the discontinuity, retracting said one set into said retracted position, moving said panel into an open position, and then repeating the steps of moving said panel to be substantially flush with said adjacent portions and positioning said sets to extend into the discontinuity.

5. Apparatus for sealing a discontinuity between a movable panel in the outer skin of a vehicle and adjacent portions of said skin and making the discontinuity virtually invisible to radar, comprising:
   a first set of a plurality of filaments mounted on said adjacent portions to extend toward said panel;
   a second set of a plurality of filaments mounted on said panel to extend toward said first set;
   each of said sets having an extended position in which its filaments extend into the discontinuity, substantially flush with the outer surfaces of said panel and said adjacent portions, and interdigitate with the filaments of the other set, to seal the discontinuity and to simulate a solid surface across the discontinuity; and said filaments of said sets having an overall electrical conductivity sufficient to simulate a constant conducting surface across the discontinuity; and
   a retracting mechanism for retracting the filaments of at least one said set of engagement with the filaments of the other said set.

6. The apparatus of claim 5, in which both said sets of filaments are retractable by said retracting mechanism.

7. The apparatus of claim 5, in which said retracting mechanism includes a bladder positioned to move said one set into interdigitating engagement with said other set when said bladder is inflated.

8. The apparatus of claim 7, in which said retracting mechanism further includes a spring positioned to retract said one set when said bladder is deflated.

9. The apparatus of claim 5, in which said retracting mechanism includes a mounting member to which the filaments of said one set are secured, and a cam for moving said mounting member.

10. The apparatus of claim 9, in which said mounting member includes a plurality of separately extendible and retractable sections.

11. The apparatus of claim 5, in which said one set of filaments includes a plurality of separately extendible and retractable sections.

* * * * *